(12) United States Patent
Murayama (10) Patent No.: US 7,251,391 B2
(45) Date of Patent: *Jul. 31, 2007

(54) OPTICAL WAVEGUIDE MOUNTING MEMBER, SUBSTRATE, SEMICONDUCTOR DEVICE, METHOD OF MANUFACTURING OPTICAL WAVEGUIDE MOUNTING MEMBER, AND METHOD OF MANUFACTURING SUBSTRATE

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/185,136

(22) Filed: Jul. 20, 2005

(65) Prior Publication Data

US 2006/0018590 A1 Jan. 26, 2006

(30) Foreign Application Priority Data

Jul. 23, 2004 (JP) ............................. 2004-216075

(51) Int. Cl.
G02B 6/26 (2006.01)
G02B 6/42 (2006.01)
G02B 6/36 (2006.01)

(52) U.S. Cl. ........................... 385/15; 385/31; 385/39; 385/52; 385/53; 385/88

(58) Field of Classification Search ................. 385/15, 385/31, 39, 52, 53, 88
See application file for complete search history.

(56) References Cited

U.S. PATENT DOCUMENTS

| 4,721,352 | A | * | 1/1988 | Sorin et al. ................. 385/11 |
| 4,934,785 | A | * | 6/1990 | Mathis et al. ............... 385/68 |
| 5,371,822 | A |   | 12/1994 | Horwitz et al. |
| 6,181,864 | B1 |   | 1/2001 | Jang et al. |
| 6,461,059 | B2 | * | 10/2002 | Ando et al. ................. 385/94 |
| 6,602,427 | B1 |   | 8/2003 | Tu |
| 6,603,782 | B2 | * | 8/2003 | Nakanishi et al. ........... 372/36 |
| 6,669,537 | B2 | * | 12/2003 | Maeda et al. ............... 451/41 |
| 6,741,778 | B1 |   | 5/2004 | Chan et al. |
| 6,904,190 | B2 | * | 6/2005 | Korenaga et al. ............ 385/14 |
| 2002/0015556 | A1 |   | 2/2002 | Steinberg |
| 2002/0028057 | A1 |   | 3/2002 | Dautartas et al. |
| 2002/0071636 | A1 |   | 6/2002 | Bazylenko et al. |
| 2002/0191944 | A1 |   | 12/2002 | Moore et al. |
| 2003/0174966 | A1 |   | 9/2003 | Murali |
| 2003/0202769 | A1 |   | 10/2003 | Gutierrez et al. |
| 2004/0037507 | A1 |   | 2/2004 | Marion et al. |

FOREIGN PATENT DOCUMENTS

| JP | 2000-321469 | 11/2000 |
| JP | 2004 054003 | 2/2004 |
| WO | WO 03/027734 | 4/2003 |

* cited by examiner

Primary Examiner—Frank G. Font
Assistant Examiner—Jerry Martin Blevins
(74) Attorney, Agent, or Firm—Ladas & Parry LLP (57) ABSTRACT

An optical waveguide mounting member for mounting to a substrate is disclosed. The optical waveguide mounting member includes an optical waveguide for transmitting optical signals therethrough and an optical waveguide mounting base material having a through-hole to which the optical waveguide is mounted. The optical waveguide mounting base material is formed of silicon.

6 Claims, 10 Drawing Sheets

OPTICAL WAVEGUIDE MOUNTING MEMBER, SUBSTRATE, SEMICONDUCTOR DEVICE, METHOD OF MANUFACTURING OPTICAL WAVEGUIDE MOUNTING MEMBER, AND METHOD OF MANUFACTURING SUBSTRATE

BACKGROUND OF THE INVENTION

1. Field of the Invention

The present invention generally relates to an optical waveguide mounting member, a substrate, a semiconductor device, a method of manufacturing an optical waveguide mounting member, and a method of manufacturing a substrate, and more particularly to an optical waveguide mounting member, a substrate, a semiconductor device, a method of manufacturing an optical waveguide mounting member, and a method of manufacturing a substrate for transmitting optic signals to an optical element via an optic fiber.

2. Description of the Related Art

Development of optical communication is advancing along with the increases in speed and size of recent information communication. Ordinarily, in optical communication, electric signals are converted to optical signals, the optical signals are transmitted through an optic fiber, and the received optical signals are converted to electric signals by an optical element having a light emission and/or light reception part (hereinafter referred to as "light emission/reception part"). The light emission/reception part is a part for transmitting and receiving optical signals. The optical element includes, for example, a vertical cavity surface emitting laser (VCSEL), a photodiode (hereinafter referred to as "PD"), and a laser diode (hereinafter referred to as "LD").

In a semiconductor device having a substrate provided with the optical element, a core part of an optic fiber, which is mounted in a through-hole penetrating the substrate, is positioned in a manner facing the light emission/reception part of the optical element.

Figure 1:
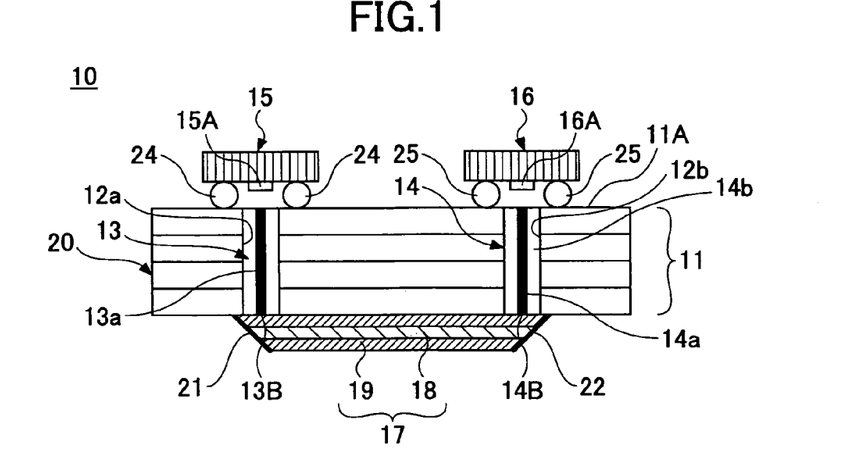
FIG. 1 is a cross-sectional view showing a conventional semiconductor device having an optical element.

A conventional semiconductor device 10 including optical elements 15 and 16 is described with reference to FIG. 1. FIG. 1 is a cross-sectional view showing the semiconductor device 10 having the optical elements 15, 16. The semiconductor device 10 mainly includes a substrate 20, optical elements 15, 16 having light emission/reception parts 15A, 16A, an optical waveguide 17, and mirrors 21, 22.

The substrate 20 mainly includes a resin base material 11, through-holes 12a, 12b, an optic fibers 13, 14, and pads (not shown), wirings (not shown), and solder resist that covers the wirings (not shown). The pads, wirings, and the solder resist are provided on a plane 11A of the resin base material 11. The pads are provided for connecting to solder balls 24, 25 of the optical elements 15, 16. The pads are provided in an exposed state (i.e. not covered by the solder resist).

The through-holes 12a, 12b are formed in the resin base material 11 in a manner penetrating the resin base material 11 by irradiating a laser (e.g. a YAG laser, a $CO_2$ laser, an excimer laser) to the resin base material 11. The through-hole 12a is provided with an optic fiber 13, and the through-hole 12b is provided with an optic fiber 14. The optic fibers 13, 14 include core parts 13a, 14a, and clad parts 13b, 14b that cover the core parts 13a, 14a. Optical signals are transmitted by the core parts 13a, 14a.

The optical element 15, which is provided with the solder ball 24, has the solder ball 24 connected to the pad (not shown) of the substrate 20. Accordingly, optical element 15 is electrically connected to the substrate 20. The optical element 15 is mounted on the substrate 20 in a manner that the light emission/reception part 15A of the optical element 15 faces the core part 13a of the optic fiber 13.

The optical element 16, which is provided with the solder ball 25, has the solder ball 25 connected to the pad (not shown) of the substrate 20. Accordingly, optical element 16 is electrically connected to the substrate 20. The optical element 16 is mounted on the substrate 20 in a manner that the light emission/reception part 16A of the optical element 16 faces the core part 14a of the optic fiber 14.

The mirror 21 is provided at an end part 13B of the optic fiber 13 and the mirror 22 is provided at an end part 14B of the optic fiber 14. The mirrors 21, 22 are provided for enabling optical transmission between the optical waveguide 17 and the optic fibers 13, 14.

The optical waveguide 17 includes a core part 18 and a clad part 19 that covers the periphery of the core part 18. The optical waveguide 17 is provided between the mirror 21 and the mirror 22 for allowing optical signals to be transmitted therethrough (See, for example, Japanese Laid-Open Patent Application No. 2004-54003).

In the semiconductor 10, it is desirable to reduce deviation between the positions of the core parts 13a, 14a of the optic fibers 13, 14 (mounted in the through-holes 12a, 12b) and the positions of the corresponding light emission/reception parts 15A, 16A facing the core parts 13a, 13b, so that transmission loss between the optic fibers 13, 14 and the light emission/reception parts 15A, 16A can be reduced.

Figure 2:
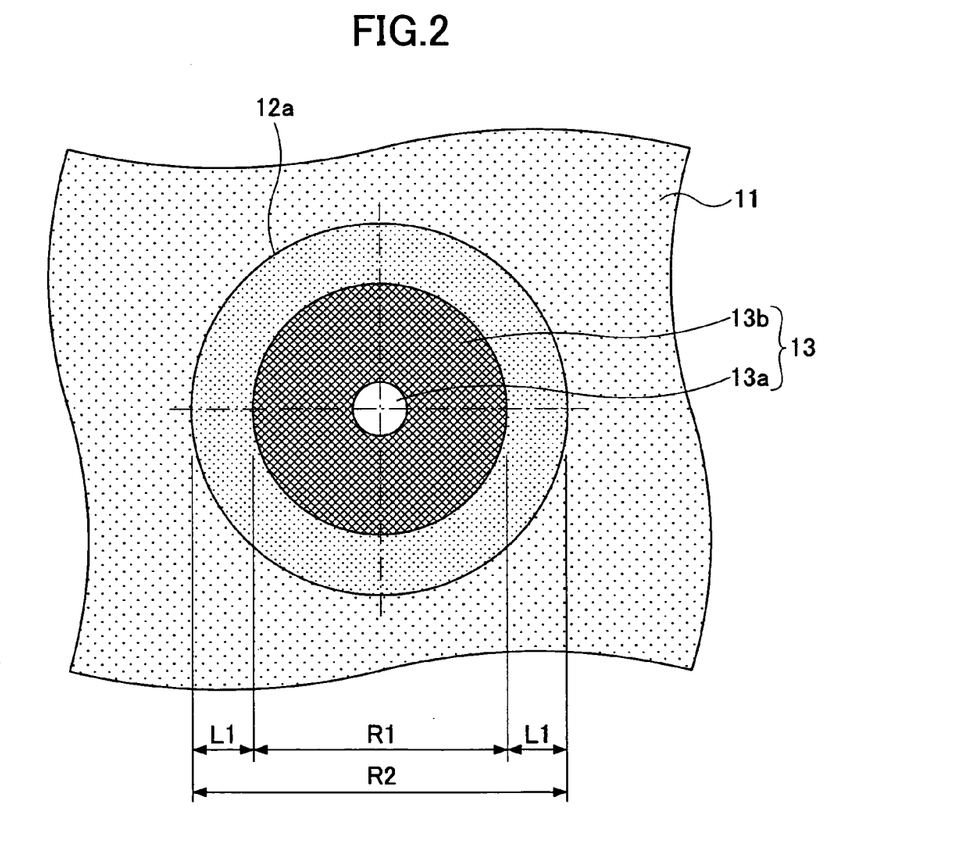
FIG. 2 is a plane view of a substrate having an optic fiber mounted in a through-hole.

FIG. 2 is a plane view of the substrate 20 having the optic fiber 13 mounted in the through-hole 12a. In FIG. 2, L1 indicates a space formed between the wall of the through-hole 12a (12b) having a diameter R2 and an outer diameter R1 of the optical fiber 13 (14) (hereinafter referred to as "space L1"). However, in the semiconductor device 10, since the through-holes 12a, 12b corresponding to the optic fibers 13, 14 are formed by irradiating a laser (e.g. a YAG laser, a $CO_2$ laser, an excimer laser) to the resin base material 11, it is difficult to form the through-holes 12a, 12b in a precise predetermined position in the resin base material 11, and it is difficult to control the size of the diameters of the through-holes 12a, 12b.

Furthermore, since a large space L1 (e.g. approximately 10 μm) is provided between the wall of the through-hole 12a, 12b having diameter R2 and the optic fiber 13, 14 having outer diameter R1 for enabling attachment between the optic fibers 13, 14 and the through-holes 12a, 12b, the position of the core parts 13a, 14a of the optic fibers 13, 14 attached to the through-holes 12a, 12b tends to deviate from the position of the corresponding light emission/reception parts 15A, 16A. This makes it difficult to reduce transmission loss of optical signals.

Furthermore, even if the position between the core parts 13a, 14a and the light emission/reception parts 15A, 16A is optimized, the resin base material 11 in which the through-holes 12a, 12b are formed may change the position of the optic fibers 13, 14 attached to the through-holes 12a, 12b in a case where thermal deformation (thermal contraction or thermal expansion) of the resin base material 11 occurs when the temperature of the substrate 20 changes. This results in an increase of transmission loss of optical signals.

Figure 3:
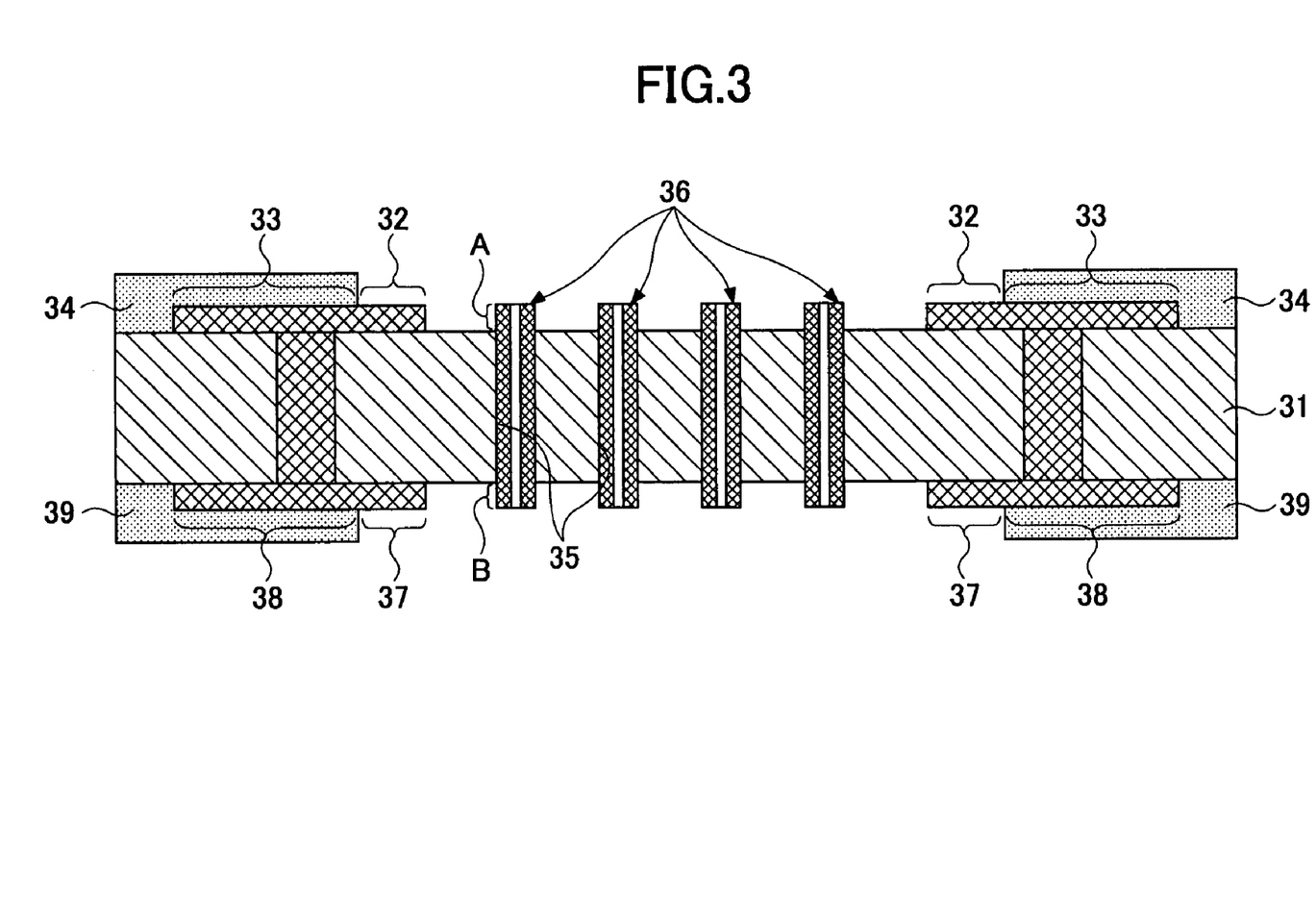
FIG. 3 is a schematic view showing an example of a substrate having an optic fiber in a state before being subjected to a polishing process.

FIG. 3 shows an example a substrate having optic fibers in a state before being subjected to a polishing process. In FIG. 3, letters "A" and "B" each indicate a part of an optic fiber 36 protruding from a resin base material 331 (hereinafter referred to as "protruding part A" and "protruding part B"). With reference to FIG. 3, the process of polishing the protruding parts A, B is performed after pads 32, 37, wirings 33, 38, and solder resist 34, 39 are formed on both sides of the resin substrate 31. Therefore, the presence of the pads 32, 37, wirings 33, 38, and solder resist 34, 39 formed on both sides of the resin substrate 31 may obstruct the process of polishing the protruding parts A, B. Therefore, it is difficult to polish the protruding parts A, B of the optic fiber 36 with satisfactory precision in a direction perpendicularly intersecting with a plane direction of the resin substrate 31.

SUMMARY OF THE INVENTION

It is a general object of the present invention to provide an optical waveguide mounting member, a substrate, a semiconductor device, a method of manufacturing an optical waveguide mounting member, and a method of manufacturing a substrate that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by an optical waveguide mounting member, a substrate, a semiconductor device, a method of manufacturing an optical waveguide mounting member, and a method of manufacturing a substrate particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides an optical waveguide mounting member for mounting to a substrate, the optical waveguide mounting member including: an optical waveguide for transmitting optical signals therethrough; and an optical waveguide mounting base material having a through-hole to which the optical waveguide is mounted; wherein the optical waveguide mounting base material is formed of silicon.

In the optical waveguide mounting member according to an embodiment of the present invention, the through-hole may be an anisotropic-etched hole.

Furthermore, the present invention provides a substrate including: the optical waveguide mounting member according to the embodiment of the present invention; and a substrate main body having a perforated part; wherein the optical waveguide mounting member is mounted in the perforated part of the substrate main body.

Furthermore, the present invention provides a semiconductor device including: an optical element having a light emission/reception part; and the substrate according to the embodiment of the present invention; wherein the optical waveguide of the substrate is positioned opposite to the light emission/reception part of the optical element.

Furthermore, the present invention provides a method of manufacturing one or more optical waveguide mounting members for mounting to a substrate, the optical waveguide mounting member having an optical waveguide for transmitting optical signals therethrough and an optical waveguide mounting base material having a through-hole to which the optical waveguide is mounted, the method including the steps of: a) forming the optical waveguide mounting base material with a silicon material; and b) forming the through-hole of the optical waveguide mounting base material by anisotropic etching.

In the method of manufacturing one or more optical waveguide mounting members according to an embodiment of the present invention, the method may further include the steps of: c) mounting the optical waveguide in the through-hole; and d) polishing a protruding part of the optical waveguide protruding from the through-hole.

Furthermore, the present invention provides a method of manufacturing a substrate to which an optical waveguide mounting member is mounted, the optical waveguide mounting member having an optical waveguide for transmitting optical signals therethrough and an optical waveguide mounting base material including a through-hole to which the optical waveguide is mounted, the method including the steps of: a) forming the optical waveguide mounting base material with a silicon material; b) forming the through-hole of the optical waveguide mounting base material by anisotropic etching; c) mounting the optical waveguide in the through-hole; d) polishing a protruding part of the optical waveguide protruding from the through-hole; e) forming a perforated part in a substrate main body; and f) mounting the optical waveguide mounting member in the perforated part.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 4:
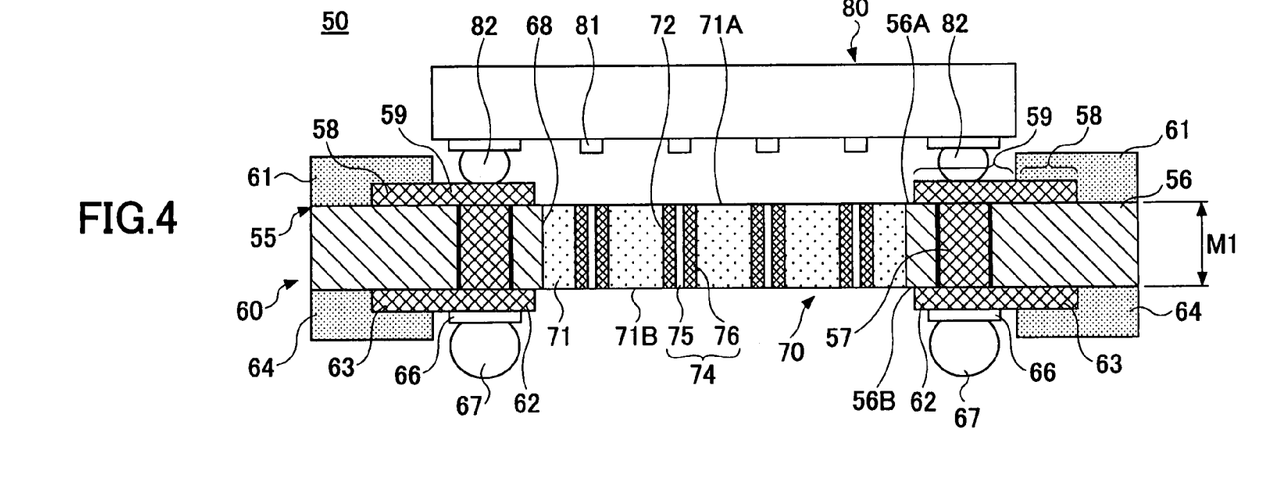
FIG. 4 is a cross-sectional view showing a semiconductor device according to an embodiment of the present invention.

A semiconductor device 50 according to an embodiment of the present invention is described with reference to FIG. 4. FIG. 4 is a cross-sectional view of the semiconductor device 50 according to the embodiment of the present invention. It is to be noted that, although there is shown in FIG. 4 only a single optical element 80 mounted on a substrate 60, multiple optical elements 80 may be mounted on the substrate 60. Furthermore, in FIG. 3, a plane 56A of a base material 56 indicates a plane of the base material 56 facing the side on which the optical element 80 is mounted, and a plane 56B of the base material 56 indicates a plane of the base material 56 facing the side to which a motherboard (not shown) is mounted.

The semiconductor device 50 mainly includes the optical element 80 and the substrate 60. The optical element 80 is an optical element for converting optic signals to electric signals. The optical element 80 includes multiple light emission/reception parts 81 and solder balls 82 serving as external connection terminals. The light emission/reception parts 51 are provided to the optical element 80 for receiving optical signals transmitted from optic fibers 74 and/or for transmitting optical signals from the optical element 80 to the optic fibers 74.

The optical element 80 includes, for example, a vertical cavity surface emitting laser (VCSEL), a photodiode (hereinafter referred to as "PD"), and a laser diode (hereinafter referred to as "LD"). The solder balls 82 are provided for electrically connecting between the optical element 80 and the substrate 60. The optical element 80 is mounted on the substrate 60 in a manner having the light emission/reception parts 81 facing toward core parts 75 of the optic fibers 41 (mounted in an optic fiber mounting member 70 of the substrate 60, described in detail below).

The substrate 60 mainly includes a substrate main body 55 and the optic fiber mounting member 70 which is an optical waveguide mounting member. The substrate 60, having the optical element 80 mounted thereto, is connected to, for example, a motherboard (not shown). The optic fiber mounting member 70 is adhesively fixed to a wall of a perforated part 68 of the substrate main body 55 in a manner that a plane 71B of the optic fiber mounting member 71 and the plane 56B of the substrate 56 are situated on a same plane.

Figure 5:
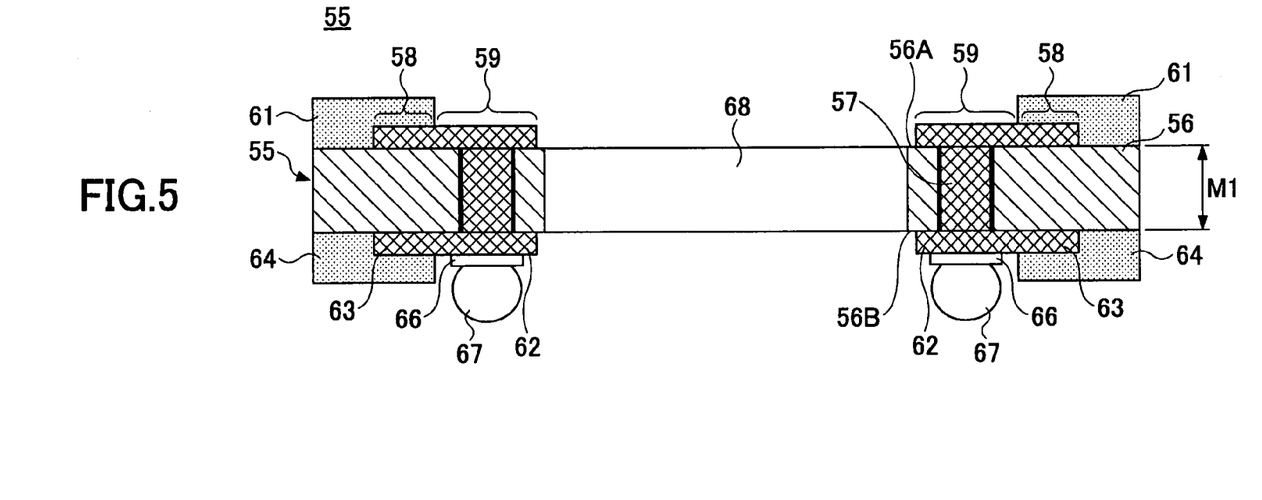
FIG. 5 is a cross-sectional view of a substrate main body according to an embodiment of the present invention.
Figure 6:
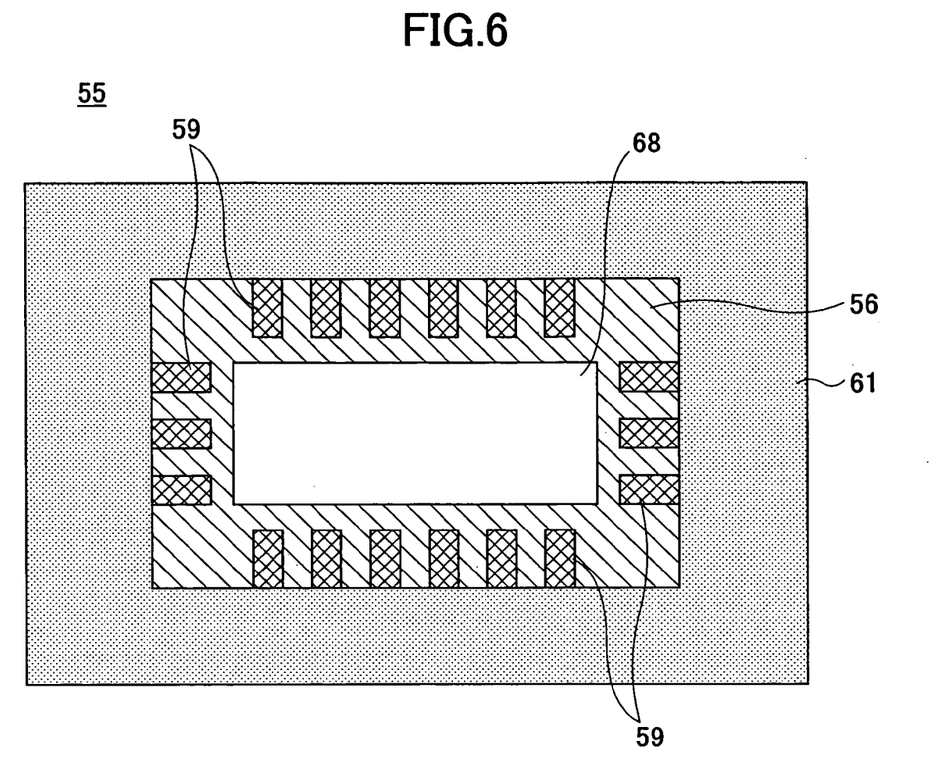
FIG. 6 is a plane view of the substrate main body shown in FIG. 5.

Next, the substrate main body 55 is described with reference to FIGS. 5 and 6. FIG. 5 is a cross-sectional view of the substrate main body 55 according to the embodiment of the present invention. FIG. 6 is a plane view of the substrate main body 55 shown in FIG. 5. The substrate main body 55 mainly includes the base material 56, a via(s) 57, pads 59, 62, wiring 58, 63, solder resist 61, 64, an Ni/Au metal layer 66, a solder ball(s) 67, and the perforated part 68.

The base material 56 is made of, for example, resin material. The base material 56 is formed with a thickness M1 of, for example, approximately 150 μm. The via 57 is formed in the base material 56 by perforating the base material 56. Furthermore, the perforated part 68 is formed at a center area of the base material 68. The optic fiber mounting member 70, having multiple optic fibers 74 mounted thereto, is mounted in the perforated part 68. The perforated part 68 is formed in a manner penetrating the base material 56.

The pad 59 is provided on the plane 56A of the base material 56 and is electrically connected to the via 57. The pad 59 is electrically connected to the solder ball 82 of the optical element 80. The wiring 58 is also provided on the plane 56A of the base material 56. The wiring 58 is electrically connected to the pad 59. The solder resist 61 is applied to the plane 56A of the base material 56 in a manner covering a part of the plane 56A of the base material 56 and the wiring 58.

The pad 62 is disposed on the plane 56B of the base material 56 and is electrically connected to the via 57. The wiring 63 is also provided on the plane 56B of the base material 56 and is electrically connected to the pad 62. The solder resist 64 is applied to the plane 56B of the base material 56 in a manner covering a part of the plane 56B of the base material 56 and the wiring 63. The solder ball 67 is electrically connected to the pad 62 via the Ni/Au metal layer 66. The solder ball 67, which is an external connection terminal, electrically connects the substrate 60 to the motherboard (not shown).

Figure 7:
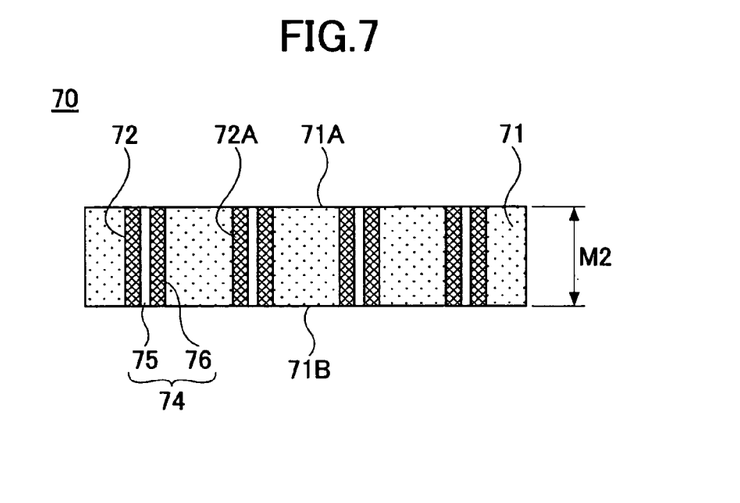
FIG. 7 is a cross-sectional view of an optic fiber mounting member according to an embodiment of the present invention.
Figure 8:
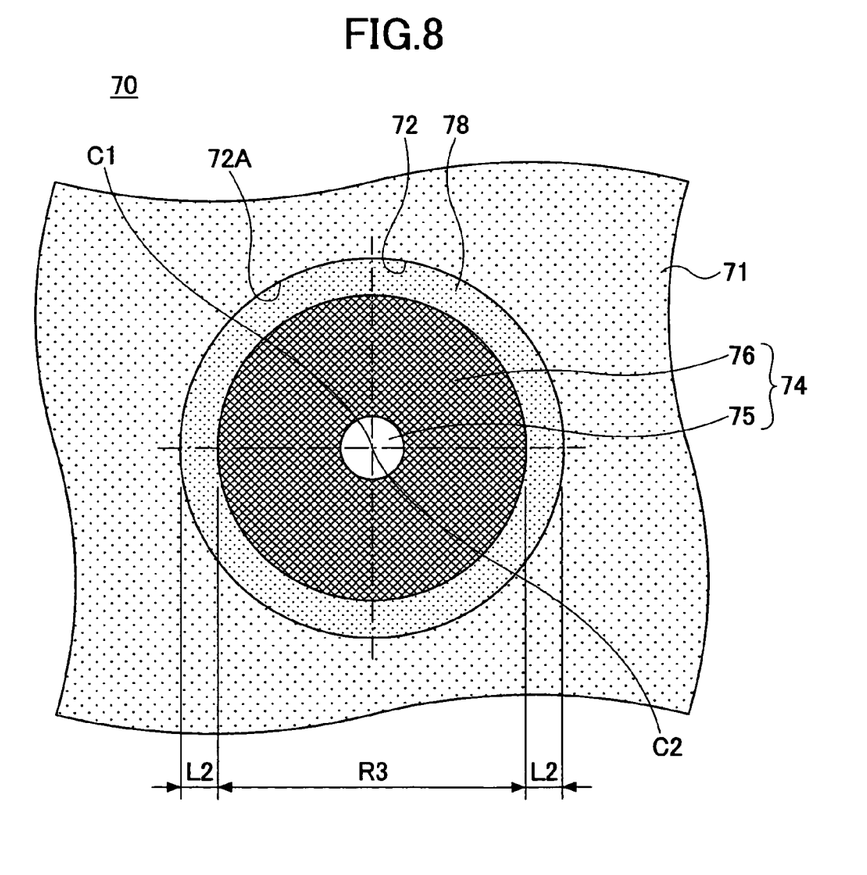
FIG. 8 is an enlarged plane view showing a part of the optic fiber mounting member having an optic fiber mounted thereto.

Next, the optic fiber mounting member 70, which is an optical waveguide mounting member, is described with reference to FIGS. 7 and 8. FIG. 7 is a cross-sectional view showing the optic fiber mounting member 70 according to the embodiment of the present invention. FIG. 8 is a plane enlarged view showing a state where the optic fiber 74 is mounted in the optic fiber mounting member 70. It is to be noted that, in FIG. 8, a center axis C1 of the core part 75 of the optic fiber 74 is matched to a center axis C2 of a through-hole 72. Furthermore, in FIG. 8, L2 indicates a space formed between the wall of the through-hole 72 and an outer diameter R3 of the optic fiber 74 (hereinafter referred to as "space L2".

The optic fiber mounting member 70 mainly includes: an optic fiber mounting base material 71 which is an optical waveguide mounting base material; the through-hole 72 to which the optic fiber 74 is mounted; and the optic fiber 74 which is an optical waveguide. The optic fiber mounting base material 71 is a base material for mounting the optic fiber 74 thereto. The optic fiber mounting base material 71 has a thickness M2 which is substantially the same as the thickness M1 of the base material 56 (M1=M2). The thickness M2 of the optic fiber mounting base material 71 may be, for example, approximately 150 μm. Furthermore, silicon is employed as the material of the optic fiber mounting base material 71.

By employing silicon as the material of the optic fiber mounting base material 71 (to which the optic fiber 74 is mounted), the optic fiber 71 can be less vulnerable to thermal deformation compared to employing a conventional resin material in a case where there is a change of heat in the optic fiber mounting base material 71. Accordingly, the position of the core part 75 of the optic fiber 74 can be prevented deviating from a corresponding position of the light emission/reception part 81 of the optical element 80. Thereby, transmission loss of optical signals between the optic fiber 74 and the light emission/reception part 80 can be reduced.

The optic fiber 74 includes the core part 75 and a clad part 76. The core part 75 is a part for transmitting optical signals. The clad part 76 is a part for protecting the core part 42 and is provided in a manner covering the core part 75. The optic fiber 74 is adhesively fixed to the through-hole 72 of the optic fiber mounting base material 71 via an adhesive material 78.

The through-hole 72 is formed by using anisotropic etching so as to penetrate the optic fiber mounting base material 71 made of silicon. The through-hole 72 is a hole for mounting the optic fiber 72 therein. The anisotropic etching may be, for example, dry etching.

Compared to forming a through-hole with a conventional method of irradiating a laser to the conventional base material 11 made of a resin, the method of forming the through-hole 72 by dry-etching the optic fiber mounting base material 71 made of silicon is able to provide greater precision in the relative position between the through-hole 72 and the light emission/reception part 81 and greater precision in the size of the through-hole 72.

Furthermore, since precision in the size of the through-hole 72 can be improved by using the dry etching technique, the size of the through-hole 72 (to which the optic fiber 74 is to be mounted) can be reduced compared to that of the conventional through-hole. Accordingly, the space L2 between the wall of the through-hole 72 and the optic fiber 74 can be reduced, thereby allowing the wall of the through-hole 72 to secure the position of the optic fiber 74. Accordingly, the position of the optic fiber 74 can be prevented from deviating from the corresponding position of the light emission/reception part 81. Thereby, transmission loss of optical signals between the optic fiber 74 and the light emission/reception part 81 can be reduced.

Figure 9:
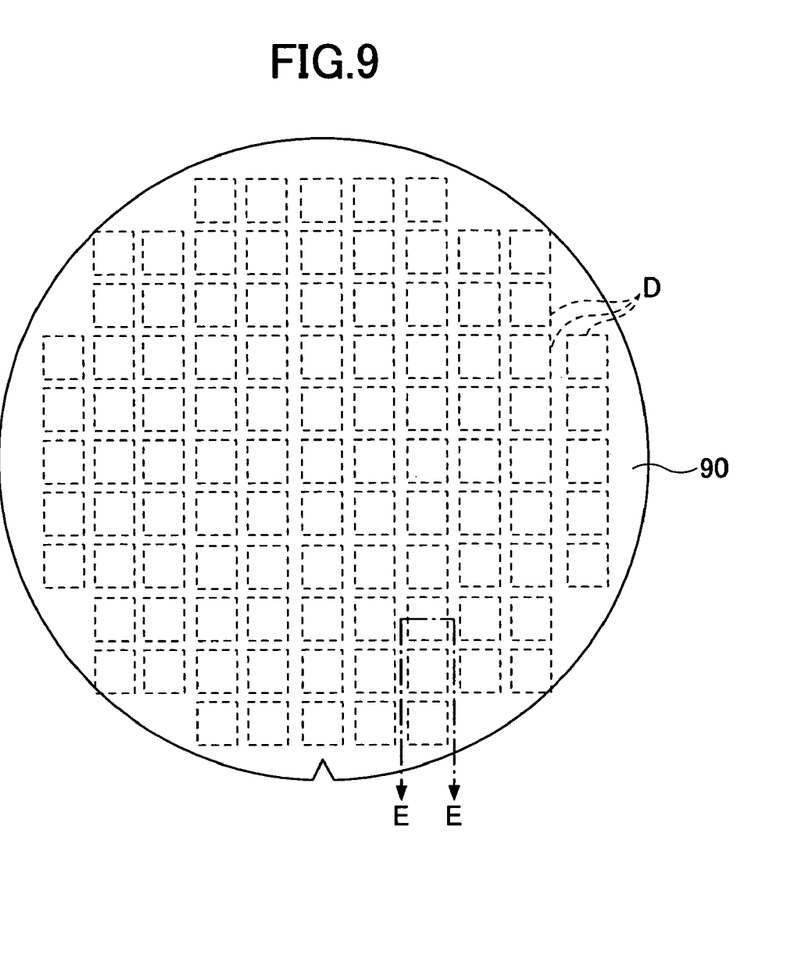
FIG. 9 is a plane view of a silicon wafer for showing the area in which optic fiber mounting members (optical waveguide mounting members) are formed.
Figure 10:
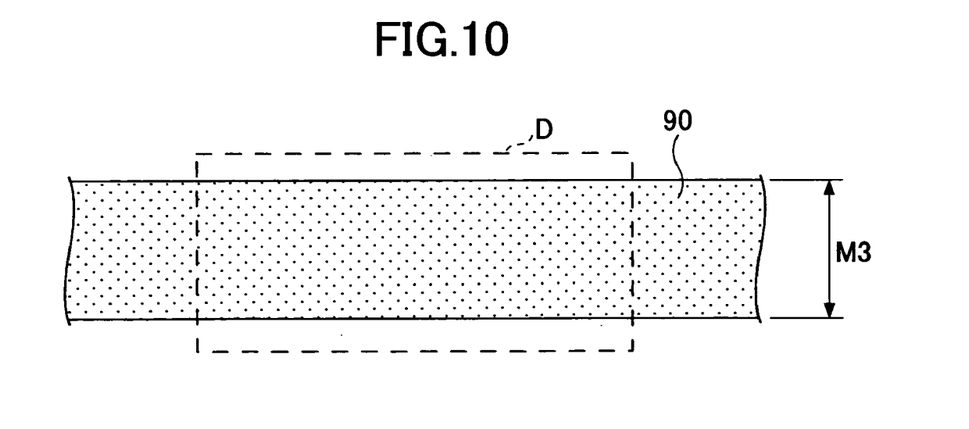
FIG. 10 is a cross-sectional view of a silicon wafer along the direction of line E-E of FIG. 9.

Next, a method of manufacturing the semiconductor device 50 according to an embodiment of the present invention is described with reference to FIGS. 9-21. It is to be noted that, detail description of the optical element 80 included in the semiconductor device 50 is omitted. FIG. 9 is a plane view of a silicon wafer for showing the area in which the optic fiber mounting member(s) 70 is formed. FIG. 10 is a cross-sectional view of a silicon wafer along the direction of line E-E of FIG. 9. It is to be noted that area D in FIGS. 9-11 indicates the area in which the optic fiber mounting member 70 is formed. Furthermore, the area I shown in FIG. 16 shows a state of the optic fiber mounting member 70 before being subjected to a dicing process. Furthermore, FIGS. 11-21 are cross-sectional views (corresponding to the cross-section of the silicon wafer taken along line E-E of FIG. 9) showing the processes of manufacturing the semiconductor device 50 according to the embodiment of the present invention (Part 1-11). In FIGS. 11-21, like components are denoted with like reference numerals as of the semiconductor apparatus 50 shown in FIG. 4.

As shown in FIG. 9, the silicon wafer 90 is used as a parent material (for example, a planar silicon material) for forming multiple optic fiber base materials 70 as a batch by performing the manufacturing method shown in FIGS. 11 to 21.

Accordingly, by forming multiple optic fiber mounting members 70 on a single silicon wafer 90 in a batch, the productivity of the optic fiber mounting members 70 can be increased and manufacturing cost of the optic fiber mounting members 70 can be reduced. A commercially available silicon wafer used for forming semiconductor chips, for example, may be employed as the silicon wafer 90. A commercially available silicon wafer 90, shown for example in FIG. 10 may have a thickness of approximately 700-800 µm.

Figure 11:
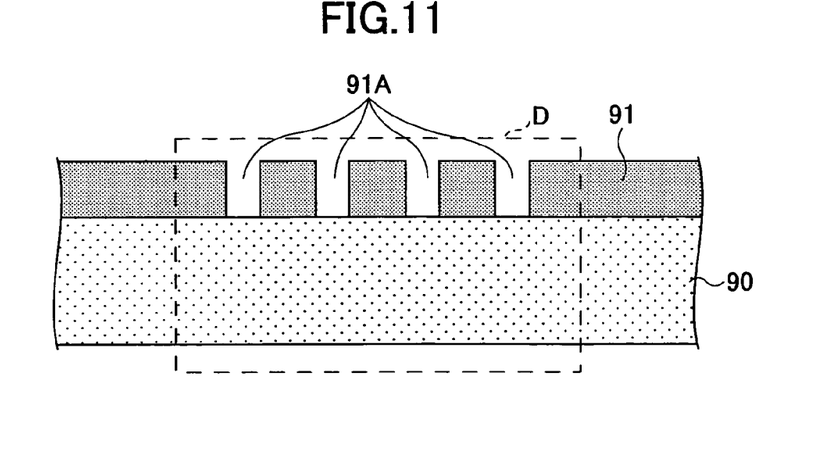
FIG. 11 is a cross-sectional view showing a process of manufacturing a semiconductor device according to an embodiment of the present invention (Part 1)
Figure 12:
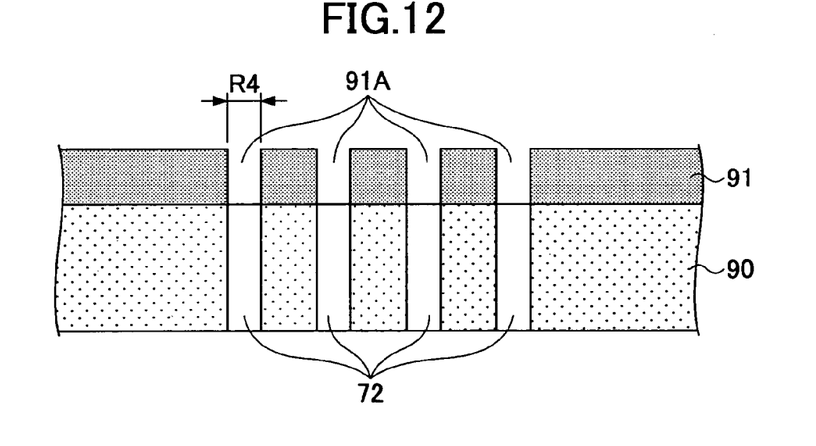
FIG. 12 is a cross-sectional view showing a process of manufacturing a semiconductor device according to an embodiment of the present invention (Part 2)

First, as shown in FIG. 11, a resist film 91 is formed on the silicon wafer 90. The resist film 91 includes aperture parts 91A for forming the through-holes 72. Next, as shown in FIG. 12, the resist film 91 is used as a mask for etching the silicon wafer 90 with an anisotropic etching method (in this example, dry-etching), and the silicon wafer 90 is etched until it is penetrated, thereby forming the through-holes 72 in the silicon wafer 90 (through-hole formation process). The diameter R4 of the through-hole 72 may be adaptively set according to the outer diameter R3 of the optic fiber 74 that is to be mounted in the through-hole 72. For example, the diameter of the through-hole 72 may be set so that the size of the space L2 (FIG. 8) is approximately 1 µm.

Figure 13:
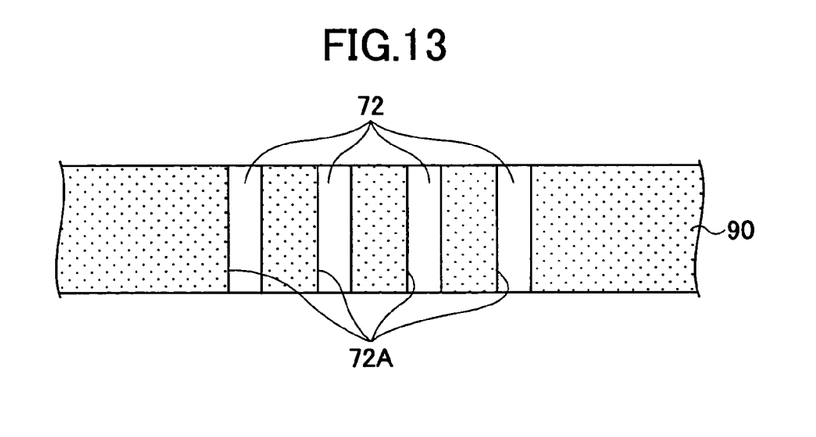
FIG. 13 is a cross-sectional view showing a process of manufacturing a semiconductor device according to an embodiment of the present invention (Part 3)
Figure 14:
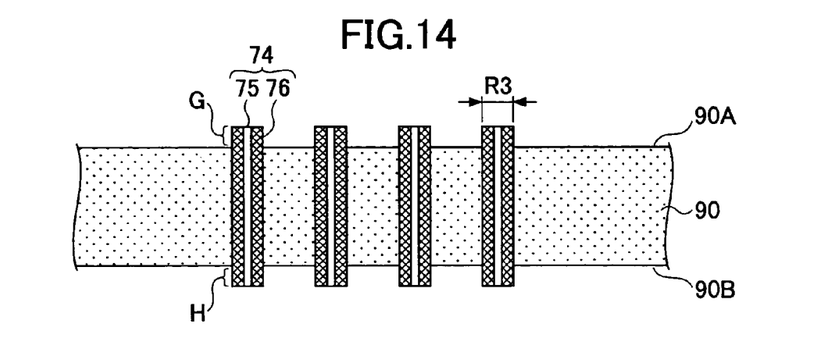
FIG. 14 is a cross-sectional view showing a process of manufacturing a semiconductor device according to an embodiment of the present invention (Part 4)

Then, as shown in FIG. 13, the resist film 91 is removed by using a resist releasing liquid. Next, as shown in FIG. 14, the optic fibers 74 (optical waveguides) are inserted in the through-holes 72 and are attached to the walls 72A of the through-holes 72 by using an adhesive agent (optical waveguide mounting process). In this step, the optic fibers 74 have protruding parts G and H protruding from planes 90A and 90B of the silicon wafer 90.

Figure 15:
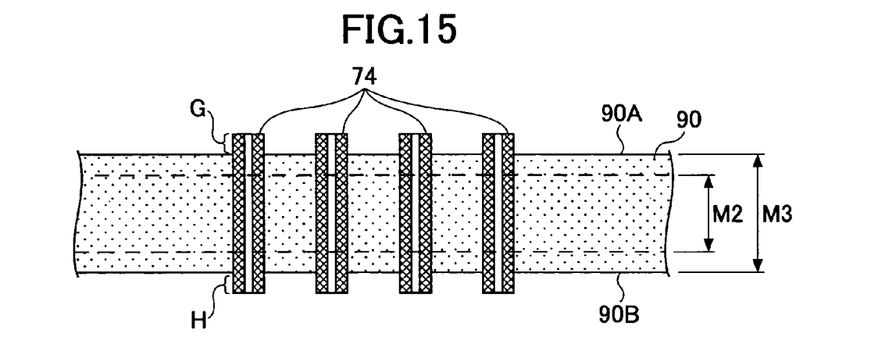
FIG. 15 is a cross-sectional view showing a process of manufacturing a semiconductor device according to an embodiment of the present invention (Part 5)
Figure 16:
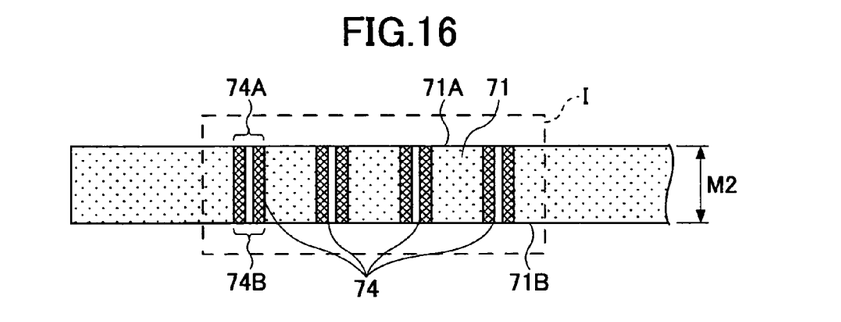
FIG. 16 is a cross-sectional view showing a process of manufacturing a semiconductor device according to an embodiment of the present invention (Part 6)

Next, as shown in FIG. 15, both planes 90A, 90B of the silicon wafer 90 are polished (polishing process). In this process, the protruding parts G, H of the optic fibers 74 are also polished. Accordingly, the optic fiber mounting base material 70 is formed with a desired thickness M2.

By forming the optic fiber mounting members 70 and the substrate main body 55 separately, the pads 59, 62, the wirings 58, 63, and the solder resist 61, 64 provided to the base material 56 can be prevented from obstructing the process of polishing the protruding parts G, H of the optic fibers 74. Thereby, the protruding parts G, H of the optic fibers 74 can be easily polished with satisfactory precision in a direction perpendicularly intersecting with a plane direction of the optic fiber mounting members 70. As the polishing apparatus used for the polishing process, a backside grinder, for example, may be used. In a case where the backside grinder is used, the silicon wafer 90 is polished one side at a time.

By performing this polishing process, multiple optic fiber mounting members 70 with the desired thickness M2 (as shown in FIG. 16) can be formed without having to be separated from one another. Furthermore, as a result of the polishing process, one plane 71A of the optic fiber mounting base material 70 becomes aligned at the same level (same plane) with one end plane 74A of the optic fiber 74, and the other plane 71B of the optic fiber mounting base material 71 becomes aligned at the same level (same plane) with the other plane 74B of the optic fiber 74.

Figure 17:
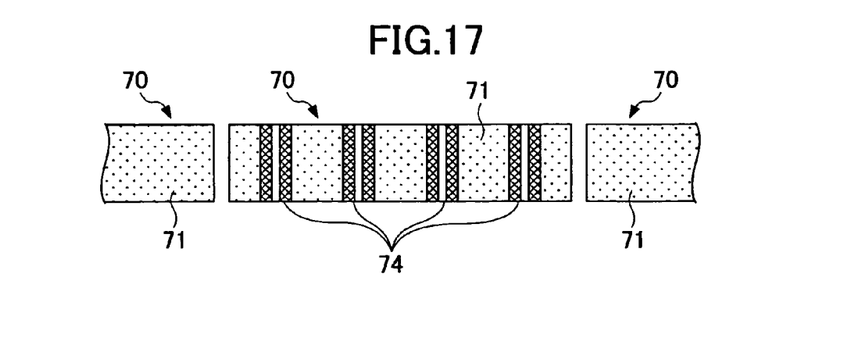
FIG. 17 is a cross-sectional view showing a process of manufacturing a semiconductor device according to an embodiment of the present invention (Part 7)

Next, as shown in FIG. 17, the optic fiber mounting members 70 are individually cut out by dicing the silicon wafer 90, to thereby obtain multiple separated optic fiber mounting members 70 in a batch.

Figure 18:
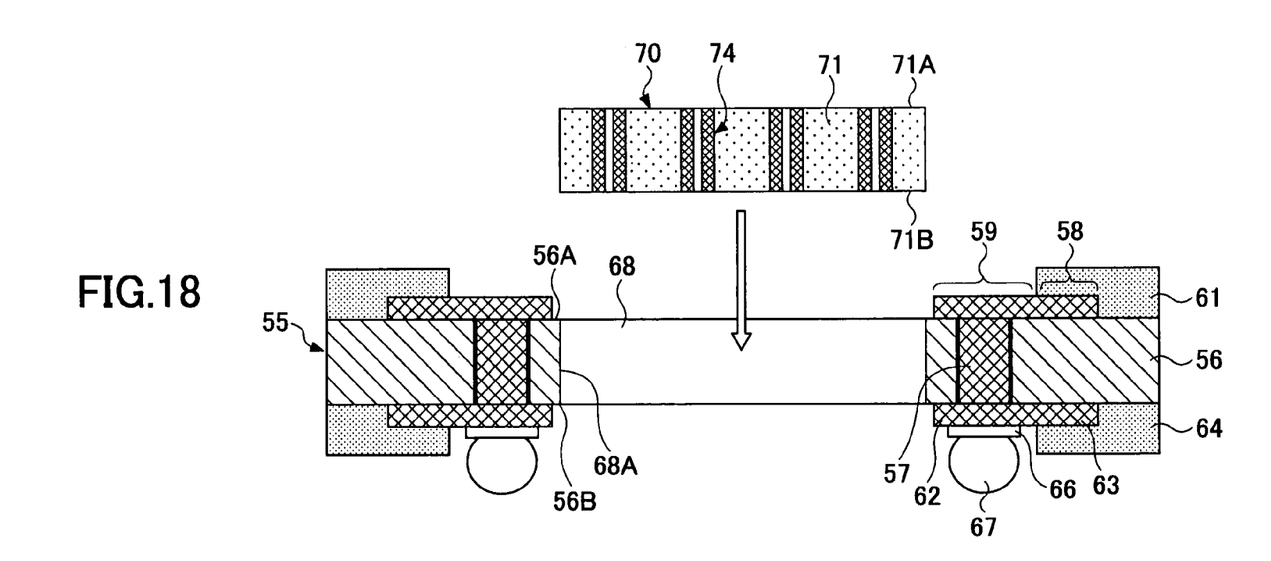
FIG. 18 is a cross-sectional view showing a process of manufacturing a semiconductor device according to an embodiment of the present invention (Part 8)
Figure 19:
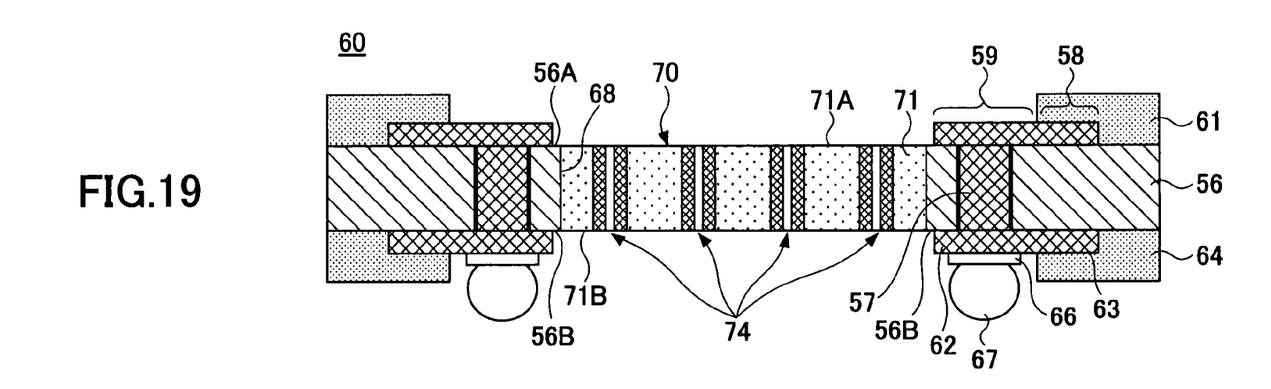
FIG. 19 is a cross-sectional view showing a process of manufacturing a semiconductor device according to an embodiment of the present invention (Part 9)

Next, as shown in FIG. 18, the perforated part 68 is formed in the center area of the substrate main body 55 (perforated part formation process). Then, the optic fiber mounting member 70 is adhesively fixed to a wall 68A of the perforated part 68 by using an adhesive agent. Accordingly, as shown in FIG. 19, the substrate 60 including the optic fiber mounting base material 71 and the substrate main body 55 is fabricated. Here, the one plane 71A of the optic fiber mounting base material 71 becomes aligned at the same level (same plane) with the plane 56A of the substrate main body 55, and the other plane 71B of optic fiber mounting base material 71 becomes aligned at the same level (same plane) with the plane 56B of the substrate main body 55.

Figure 20:
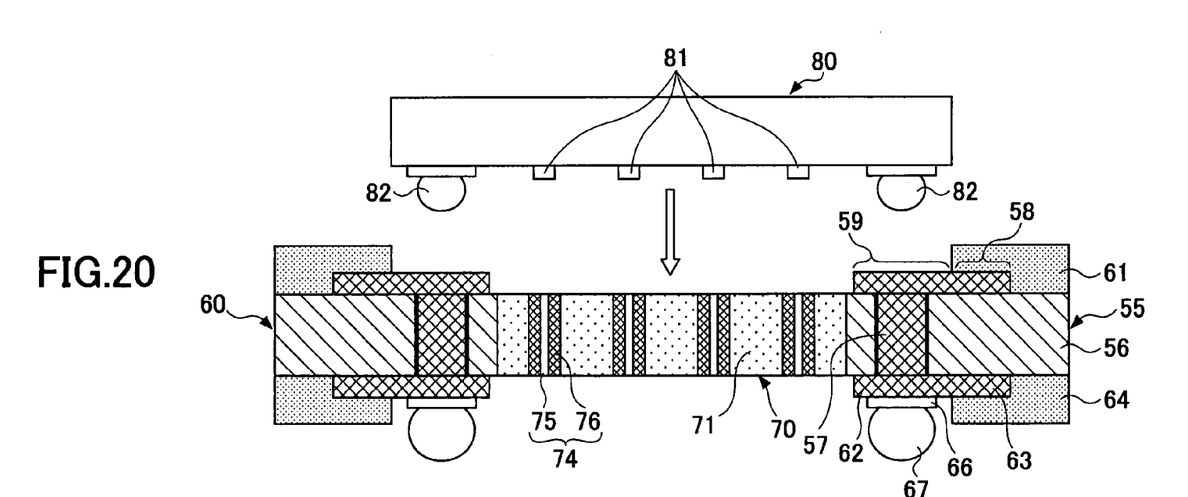
FIG. 20 is a cross-sectional view showing a process of manufacturing a semiconductor device according to an embodiment of the present invention (Part 10)

Next, as shown in FIG. 20, the position between the light emission/reception parts 81 of the optical element 80 and the core parts 75 of the optic fibers 74 are adjusted by monitoring the position with a photo-detection measurement apparatus (not shown), to thereby determine an optimum position on the substrate 60 for mounting the optical element 80 (hereinafter referred to as "optimum position").

Figure 21:
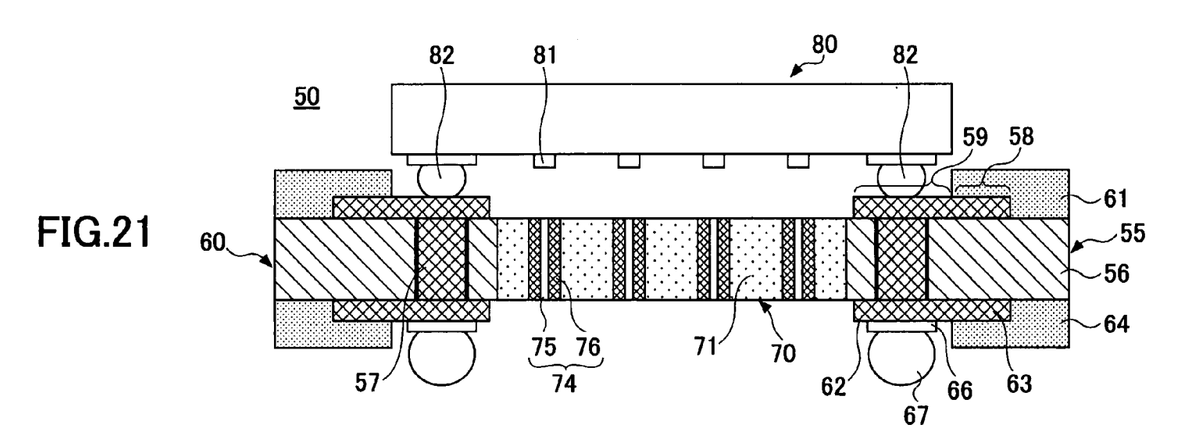
FIG. 21 is a cross-sectional view showing a process of manufacturing a semiconductor device according to an embodiment of the present invention (Part 11).

Next, as shown in FIG. 21, in accordance with the measured results obtained with the photo-detection measurement apparatus, the fabrication of the semiconductor device 50 is completed by mounting the optical element 80 on the substrate 60 in a manner that the solder balls 82 are electrically connected to the pads 59.

By fabricating the optic fiber mounting member 70 and the substrate main body 55 separately, and forming the through-holes 72 in the optic fiber mounting base material 71 made of silicon with the dry-etching technique, the precision in the relative position between the through-holes 72 and the light emission/reception parts 81 as well as the precision in the size of the through-holes 72 can be improved. Thereby, transmission loss of optical signals between the optic fiber 74 and the light emission/reception part 81 can be reduced. Furthermore, the process of polishing the optic fiber 74 can be easily performed with satisfactory precision. Furthermore, by separately forming the optic fiber mounting member 70 and the substrate main body 55 of the substrate 60, the productivity of the substrate 60 can be improved.

It is to be noted that, the substrate 60 according to the embodiment of the present invention may alternatively be fabricated with a multilayer wiring configuration in which multiple insulating layers and wirings are provided to the base material 56. Furthermore, components other than solder balls may be alternatively used for connecting the optical element 80 and the substrate 60.

Further, the present invention is not limited to these embodiments, but various variations and modifications may be made without departing from the scope of the present invention.

The present application is based on Japanese Priority Application No. 2004-216075 filed on Jul. 23, 2004, with the Japanese Patent Office, the entire contents of which are hereby incorporated by reference.

What is claimed is:

1. An optical waveguide mounting member for mounting to a substrate, the optical waveguide mounting member comprising:
   an optical waveguide for transmitting optical signals therethrough; and
   an optical waveguide mounting base material having first and second planes and a through-hole to which the optical waveguide is mounted from the first plane to the second plane, in a direction perpendicularly intersecting an optical element mounted on top of the first plane;
   wherein the optical waveguide mounting base material is formed of silicon
   wherein the optical waveguide has first and second ends that protrude from the first and second planes and are polished to be flush with respect to the first and second planes prior to mounting the optical waveguide mounting member to the substrate;
   wherein the distance between the polished first and second ends is substantially equal to the thickness of the substrate when mounting the optical waveguide mounting member to the substrate.

2. The optical waveguide mounting member as claimed in claim 1, wherein the through-hole is an anisotropic-etched hole.

3. A substrate comprising:
   the optical waveguide mounting member as claimed in claim 1; and
   a substrate main body having a perforated part;
   wherein the optical waveguide mounting member is mounted in the perforated part of the substrate main body.

4. A semiconductor device comprising:
   an optical element having a light emission/reception part; and
   the substrate as claimed in claim 3;
   wherein the optical waveguide of the substrate is positioned opposite to the light emission/reception part of the optical element.

5. A method of manufacturing one or more optical waveguide mounting members for mounting to a substrate, the optical waveguide mounting member having an optical waveguide for transmitting optical signals therethrough and an optical waveguide mounting base material having first and second planes and a through-hole to which the optical waveguide is mounted, from the first plane to the second plane, in a direction perpendicularly intersecting an optical element mounted on top of the first plane, the optical waveguide having first and second ends that protrude from the first and second planes, the method comprising the steps of:
   a) forming the optical waveguide mounting base material with a silicon material;
   b) forming the through-hole of the optical waveguide mounting base material by anisotropic etching;
   c) mounting the optical waveguide in the through-hole; and
   d) polishing the first and second ends protruding from the first and second planes to be flush with respect to the first and second planes, prior to mounting the optical waveguide mounting member to the substrate;
   wherein the distance between the polished first and second ends is substantially equal to the thickness of the substrate when mounting the optical waveguide mounting member to the substrate.

6. A method of manufacturing a substrate to which an optical waveguide mounting member is mounted, the optical waveguide mounting member having an optical waveguide for transmitting optical signals therethrough and an optical waveguide mounting base material including first and second planes and a through-hole to which the optical waveguide is mounted, from the first plane to the second plane, in a direction perpendicularly intersecting an optical element mounted on top of the first plane, the optical waveguide having first and second ends that protrude from the first and second planes, the method comprising the steps of:

a) forming the optical waveguide mounting base material with a silicon material;

b) forming the through-hole of the optical waveguide mounting base material by anisotropic etching;

c) mounting the optical waveguide in the through-hole;

d) polishing the first and second ends protruding from the first and second planes to be flush with respect to the first and second planes;

e) forming a perforated part in a substrate main body; and f) mounting the optical waveguide mounting member in the perforated part after step d);

wherein the distance between the polished first and second ends is substantially equal to the thickness of the substrate when mounting the optical waveguide mounting member in the perforated part.

* * * * *